United States Patent [19]
Dickey et al.

[11] Patent Number: 5,141,603
[45] Date of Patent: Aug. 25, 1992

[54] CAPACITOR METHOD FOR IMPROVED OXIDE DIELECTRIC

[75] Inventors: John R. Dickey, Muncie, Ind.; Jimmy L. Davidson, Nashville, Tenn.; Yonhua Tzeng, Auburn, Ala.

[73] Assignee: The United States of America as represented by the Secretary of the Air Force, Washington, D.C.

[21] Appl. No.: 595,648

[22] Filed: Oct. 11, 1990

Related U.S. Application Data

[62] Division of Ser. No. 173,951, Mar. 28, 1988, abandoned.

[51] Int. Cl.⁵ .................................... C25D 11/12
[52] U.S. Cl. ............................. 205/124; 361/313; 361/322; 205/175; 205/328; 205/332
[58] Field of Search .................... 204/38.3, 42, 58, 15; 361/311, 313, 322

[56] References Cited

U.S. PATENT DOCUMENTS

| | | | |
|---|---|---|---|
| 2,174,840 | 10/1939 | Robinson et al. | 204/37.1 X |
| 2,930,951 | 3/1960 | Burger et al. | 317/242 |
| 3,254,282 | 5/1966 | West | 361/322 |
| 3,270,261 | 8/1966 | Mohler et al. | 361/322 |
| 3,682,790 | 8/1972 | Orth et al. | 204/58 |
| 3,741,880 | 6/1973 | Shiba et al. | 204/15 |
| 3,872,360 | 3/1975 | Sheard | 361/311 X |
| 3,971,710 | 7/1976 | Romanikiw | 204/15 |
| 4,089,756 | 5/1978 | Lerner et al. | 204/58 |
| 4,481,083 | 11/1984 | Ball et al. | 204/38 |
| 4,827,323 | 5/1989 | Tigelaar et al. | 357/51 |

OTHER PUBLICATIONS

Walter W. E. Hübner, The Practical Anodizing of Aluminum, MacDonald & Evans, London, 1960, pp. 35-40, 44-46.

J. R. Dickey et al, "Improved Dielectric Properties . . . ", J. Electrochem. Soc., vol. 136, No. 6, Jun., 1989, pp. 1772-1776.

F. A. Lowenheim, *Electroplating*, McGraw-Hill Book Co., New York, 1978, pp. 452-478.

Walter W. E. Hübner, The Practical Anodising of Aluminum, MacDonald & Evans, London, 1960, pp. 20-29.

R. C. Merrill and R. A. West, Abstract 1, Electrochem. Soc. Extended Abstracts Spring Meeting, Pittsburgh, Pa. Apr. 15-18, 1963.

Conference Program, Electrochemical Society, Boston, Mass. Spring '86.

Presentation with Abstract from Electrochemical Society Inc., Boston, Mass. Spring 1986 Meeting, May 4-9, 1986.

Masters Thesis, John R. Dickey, Bibliography.

*Primary Examiner*—John Niebling
*Assistant Examiner*—William T. Leader
*Attorney, Agent, or Firm*—Gerald B. Hollins; Donald J. Singer

[57] ABSTRACT

Capacitor structure capable of achieving increased energy storage density is disclosed together with a fabrication sequence for the capacitor and its anodic oxide dielectric material. Soft porous aluminum oxide which has been formed in a first anodization step and has been densified or transformed to hard barrier oxide in a second anodization step is preferred for the capacitor dielectric material. The first anodization may be performed in a sulfuric acid electrolyte while the second anodization may be performed in a boric acid electrolyte. The boric acid may be diluted with ethylene glycol. The disclosed capacitor is fabricated on a silicon wafer substrate.

4 Claims, 3 Drawing Sheets

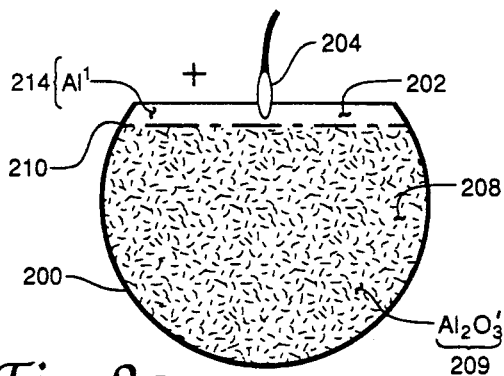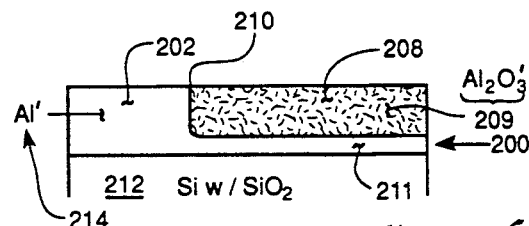
Fig. 2a　　　Fig. 2b
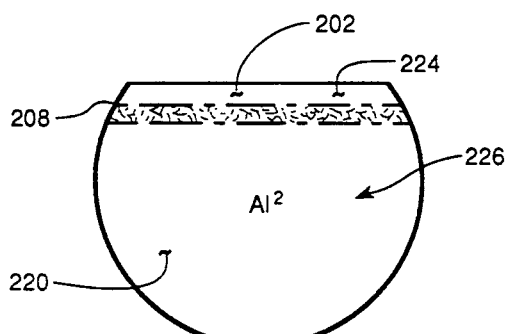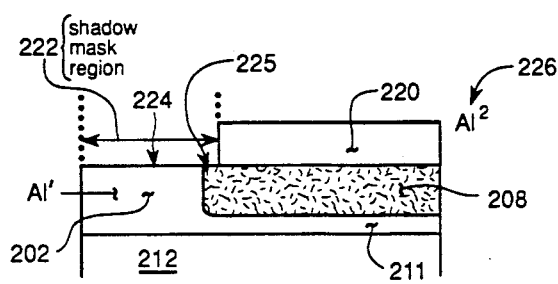
Fig. 2c　　　Fig. 2d
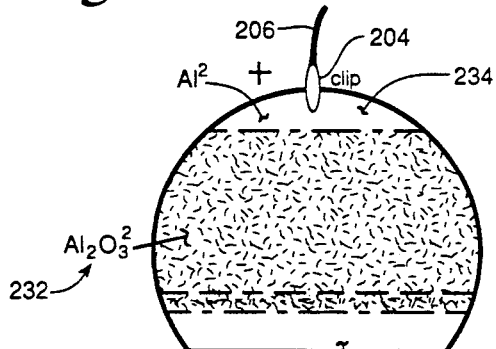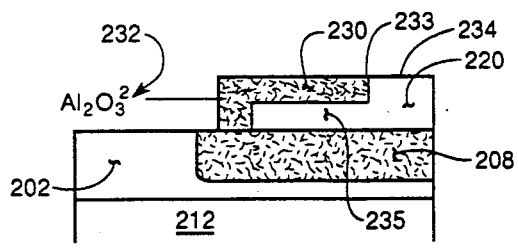
Fig. 2e　　　Fig. 2f
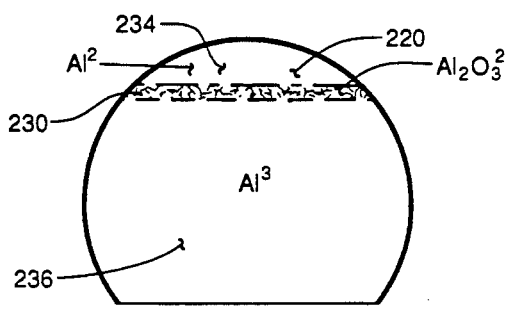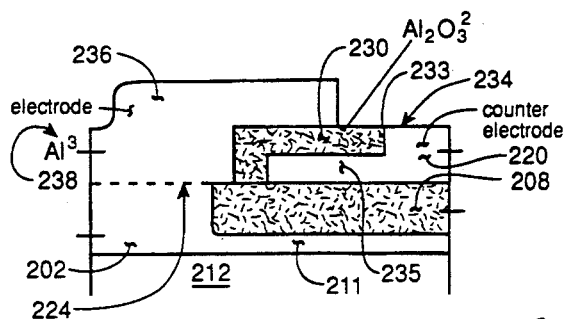
Fig. 2g　　　Fig. 2h

CAPACITOR METHOD FOR IMPROVED OXIDE DIELECTRIC

RIGHTS OF THE GOVERNMENT

The invention described herein may be manufactured and used by or for the Government of the United States for all governmental purposes without the payment of any royalty.

This application is a division of application Ser. No. 07/173,951, filed Mar. 28, 1988 now abandoned.

CROSS REFERENCE TO RELATED APPLICATIONS

The present application relates to a companion patent document titled THIN FILM OXIDE DIELECTRIC STRUCTURE AND METHOD. U.S. Pat. No. 4,936,957 issued Jun. 26, 1990 and filed of even date herewith and which is hereby incorporated by reference herein.

BACKGROUND OF THE INVENTION

This invention relates to the field of electrical capacitors of the type which employ oxide dielectric materials.

The use of chemically formed dielectric materials in electrical capacitors, especially in energy storing capacitors is a well established practice which dates back to at least the 1920's era. The electrolytic capacitors used in power supply wave filtering and more recently, as signal coupling reactive elements in radio, television, computer and electronic apparatus, are notable examples of capacitors which employ chemically derived dielectric materials. Frequently, in these capacitors, a metallic electrode member is fabricated from materials such as aluminum or tantalum with an oxide of the electrode material serving as the dielectric insulator between adjacent capacitor electrodes.

As the physical size and mass associated with electronic apparatus has decreased through the vacuum tube, transistor and integrated circuit eras, a need for capacitor elements of smaller physical size and enhanced electrical performance has intensified. In recent years, the need for electronic apparatus in space equipment such as communications satellites, vehicles which deliver satellites, and other space hardware, together with the possibility of deploying defensive weaponry into space, has particularly intensified the need for improved capacitors. In the latter use group, the prospect of deploying lasers, kinetic energy weapons, and other energy delivering systems into space has particularly intensified the search for enhanced performance electrical energy storage capacitors-capacitors which are capable of rapidly delivering a store of energy accumulated over a period of time while occupying a minimal amount of physical volume and having low physical mass.

Presently, available capacitor technology is found to limit capacitor energy storing to the range of 40 joules of electrical energy per kilogram of capacitor weight or about 88 joules per pound of weight. A large factor in determining this energy per unit mass capability resides in the limiting capability of presently available capacitor dielectric materials. Especially limiting are the thermal conductivity, capacitance density, breakdown voltage, resistivity, relative permativity and dissipation factor characteristics of the available dielectric materials.

The capacitors of the present invention achieve energy storage density at a rate which is in the range of 1 megajoule per cubic foot of volume with a weight of some 440 pounds or at a rate of 2270 joules per pound of weight. This improved capacitor performance ability is achieved largely through the use of dielectric materials of enhanced electrical and physical properties such as are described in the above referenced co-pending patent document. The capacitors of such characteristics are especially envisioned for use in the space weaponry field—such as in the currently active Strategic Defense Initiative (SDI) program wherein devices of heretofore unprecedented energy delivery rate are contemplated for parking in space orbit.

SUMMARY OF THE INVENTION

In the present invention, electrical capacitors employing improved dielectric material such as is disclosed in the above referred to co-pending patent document are provided.

It is an object of the present invention therefore to provide an electrical capacitor element having increased energy storage capability per unit of capacitor volume.

It is another object of the invention to provide an electrical capacitor element having increased energy storage capability per unit of capacitor weight.

It is another object of the invention to provide a physical arrangement into which improved energy storage capacitors can be fabricated.

It is another object of the invention to provide a capacitor fabrication method applicable to the improved capacitor configuration.

It is another object of the invention to provide a capacitor fabrication method which is generic to a number of physical dispositions of improved energy storage capacitors.

It is another object of the invention to provide/-capacitor materials and fabrication arrangements which are useful in the fabrication of energy storage and other varieties of electrical capacitors.

It is another object of the invention to provide improved dielectric material capacitor structures which may be applied to capacitors produced in large quantity.

It is another object of the invention to provide an electrically insulated electrical conductor which may be used in the fabrication of improved electrical capacitors.

Additional objects and features of the invention will be understood from the following description and the accompanying drawings.

These and other objects of the invention are achieved by an electrical capacitor which includes a first metallic aluminum electrode member connected to a first capacitor electrical terminal, the electrode member including on one surface thereof a layer of hard barrier aluminum oxide dielectric material disposed over the electrode member surface and a layer of soft turned hard transformed porous aluminum oxide dielectric material covering the layer of hard barrier aluminum oxide dielectric material; a second metallic aluminum electrode member disposed on the layers of dielectric material and connected to the second electrical terminal of the capacitor.

BRIEF DESCRIPTION OF THE DRAWINGS

FIG. 2 shows additional details in the fabrication of one physical arrangement of a capacitor made according to the invention.

DETAILED DESCRIPTION

Figure 1:
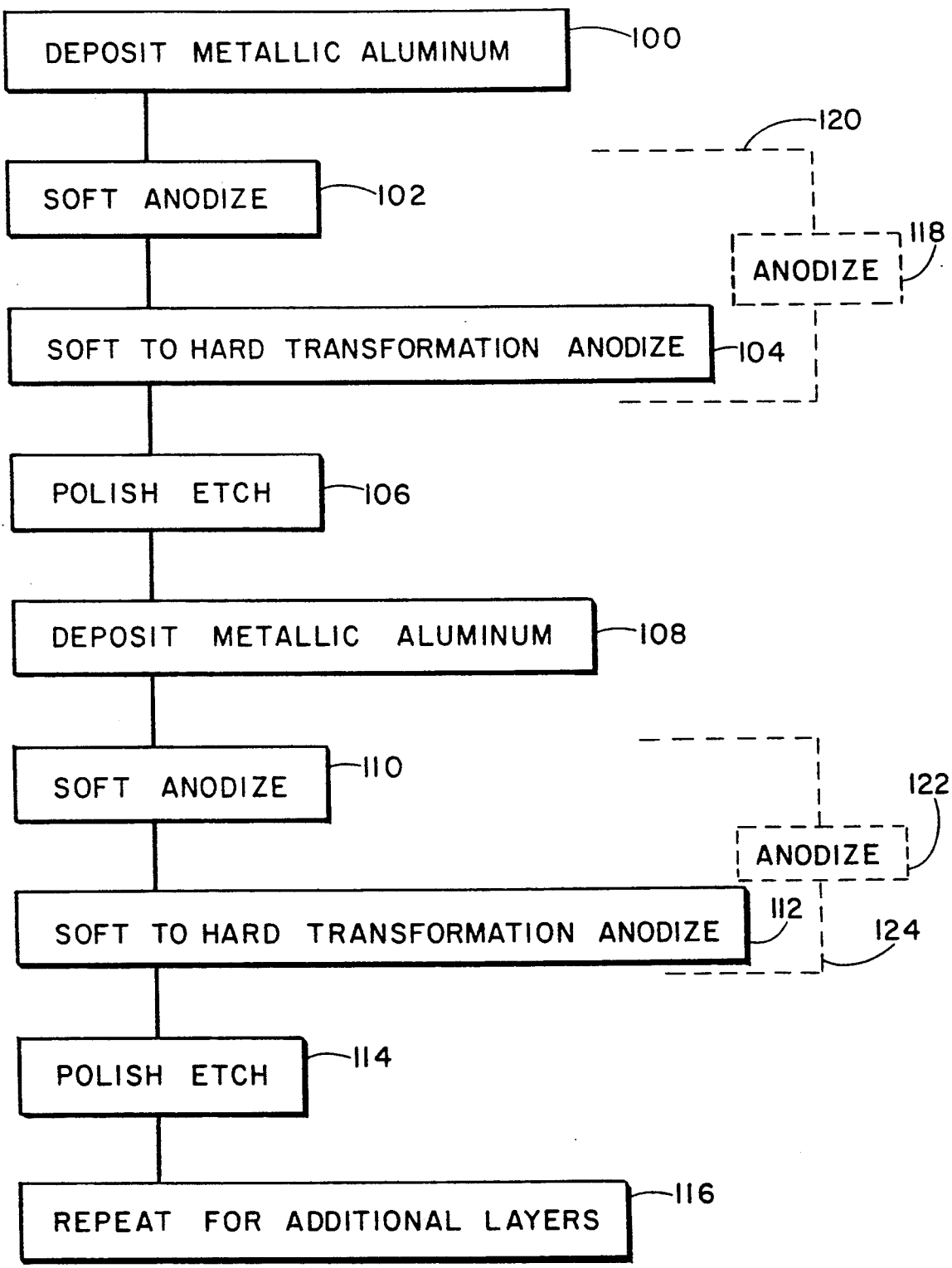
FIG. 1 shows a block diagram of the major steps in fabricating portions of a capacitor according to the invention.

FIG. 1 in the drawings shows a fabrication sequence which is generic to a number of possible different capacitor physical dispositions that are in accordance with the present invention. As indicated in the FIG. 1 sequence, a capacitor substrate member such as a silicon wafer receives a film of metallic aluminum in the block 100 and is then subject to soft anodization in the block 102 to form a layer of porous aluminum oxide. In the block 104 of FIG. 1, the soft anodization aluminum oxide is transformed or desified or converted into hard aluminum oxide possibly according to a process which is described in the above referred co-pending patent application—and to provide a layer of hard or barrier oxide over the metallic aluminum remaining from the step of block 100. The two anodizations of blocks 102 and 104 may be referred to grossly as an anodization sequence as is indicated by the dotted block at 118 and the dotted connecting line 120 in FIG. 1.

The metallic aluminum of block 100 and the anodization of blocks 102 and 104 form one electrode, and its dielectric insulation, for an electrical capacitor. In the steps following block 104, the opposed or counter electrode is formed together with its insulating layer for use with a possible third electrode and so on. Prior to formation of the opposed or counter electrode, however, it is desirable to preclude the increasing roughness which tends to occur with each successive level in a capacitor employing the described sequential formation steps. Increasing roughness in successive layers can be avoided through the use of a polishing etch for the anodizations accomplished in block 102 and block 104 in FIG. 1. This polishing etch is indicated in the block 106 in FIG. 1 and may, for example, be accomplished with an etchant such as a solution of $H_3PO_4(5\%)+CrO_3(2\%)+H_2O$ which may be used at 85° C. for the removal of surface protrusions. This solution provides an 85° C. etch rate which is in the range of 2.7 Å/sec. The etch achieves an oxide topology which is more uniformly smooth and promotes an even oxide formation in successive layers of the capacitor structure.

The deposition of opposed or counter electrode aluminum, is indicated in the block 108 of FIG. 1 and the soft and hard anodization of this aluminum is indicated in the blocks 110 and 112. The formation of a hard aluminum oxide through the use of anodizing transformation between soft and hard oxides is also employed for the counter electrodes as is indicated by the transformation of block 112. The two anodizations of blocks 110 and 112 may also be referred to grossly as an anodizing step in keeping with the indication of block 118 in FIG. 1, the dotted block 122 and the connecting line 124 in FIG. 1. The polishing etch of block 106 is repeated at block 114 for the dielectric material of the counter electrodes-in preparation for the addition of another metallic aluminum layer which is indicated at block 116 and is according to the block 100 in FIG. 1. Multiple layers are, of course, desirable in most capacitor arrangements, especially in the case of energy storage capacitors in order to achieve increased energy storage density per units of volume and weight. In such multiple layer capacitors, the double-sided usage of intermediate capacitor element electrodes increases utilization efficiency.

Steps preceding the block 100 achievement of a metallic aluminum film which may include a sputtered deposition of aluminum onto a smooth planar surface, are omitted from the diagram of FIG. 1 in the interest of simplification. Information regarding many of these steps including the selection of a silicon wafer, thermal oxidation of the wafer surface, surface cleaning (e.g. by the Huang clean procedure known in the art) are described in the above identified co-pending patent document.

Also omitted in FIG. 1 and described in the co-pending patent application are several rinsing steps and baking steps, the latter are normally desired for removing retained moisture following anodizing. Wafer baking at temperatures in the range of 200°-300° C. for times between one and ten hours are desirable for such moisture removal.

Use of the FIG. 1 generic process in fabricating one physical arrangement of a capacitor according to the present invention is illustrated in FIG. 2 of the drawings. The capacitor achieved in the FIG. 2 sequence of steps may be identified as a multi-layered thin film capacitor achieved through the use of a wafer rotation anodizing sequence. In FIG. 2, the drawings at FIG. 2A and FIG. 2B represent front and cross-sectional views of step one in the capacitor formation sequence. Similarly, step two in this sequence is shown by the drawings of FIGS. 2C and 2D in frontal and cross-sectional views. Steps three and four are indicated by the drawings of FIGS. 2E and 2F, and FIGS. 2G and 2H, respectively. Step numbers in the FIG. 2 sequence are indicated by numbers appearing along the left-hand drawing edge under the column heading of step number which is indicated at 240. The column heading at 242 refers to the frontal views of FIGS. 2A, 2C, 2E and 2G in FIG. 2, while the column heading at 244 identifies the views of FIGS. 2B, 2D, 2F, and 2H as cross-sectional views. A fifth step in the FIG. 2 sequence is indicated at 246 and involves repetition of some of the earlier performed steps in an additional layer forming operation.

The wafer 200 of step one in FIG. 2, is presumed to have received the metallic aluminum coating of block 100 in FIG. 1, and thereby, the FIG. 2 sequence commences with anodization steps—steps according to blocks 102 and 104 in FIG. 1. The resulting oxide material from this first anodization is identified at 208 in FIG. 2, and also is identified by the chemical symbol and superscript 1 at 209-which identify the oxide as a part of layer 1 of the capacitor. The initial layer of metallic aluminum is also identified with a chemical symbol and superscript as shown at 214 in FIG. 2A and FIG. 2D. The substrate silicon material, which is presumed to have a layer of silicon dioxide on the surface thereof, is indicated at 212 in FIG. 2B.

The anodization of step one and FIGS. 2A and 2B is arranged to exclude a portion of the metallic aluminum, the portion identified at 202 in FIGS. 2A and 2B in order that a surface for attaching the anodize current delivering clip and the conductors 204 and 206 remain in integral condition for anodizing current flow and for subsequent use. The line of demarcation between anodized and integral metal portions of the FIG. 2A and 2B wafer is indicated at 210 in these figures.

The anodization of step one and FIGS. 2A and 2B is presumed to be of either the hard anodize or the soft, turned hard anodization described in the co-pending patent document, the latter being preferred in accordance with the benefits of soft, turned hard oxide recited in the co-pending patent document. The existence of a residual layer of soft oxide in the fabricated dielectric material is an optional or selectable variable consideration in the capacitor design.

During soft anodization, a constant current energization is preferred at a current level of 1.5 milliamps per square centimeter of one side wafer surface being anodized. This current density results in an anodizing voltage which ramps upward from zero to about 12 volts during a time of 0.6 to 0.8 minutes. The presence of an initial layer of hard oxide, which is inherently formed during the soft anodizing as explained in the co-pending patent document, is presumed. As is disclosed in the copending patent document a sulfuric acid electrolyte and six degree Celsius temperature may be used for the soft anodization.

Hard anodization under 200 volt constant voltage conditions is preferred with a current density which rises from zero to 1.4 milliamps per square centimeter over a time of about 500 milliseconds or less and thereafter, exponentially decays to a value near 0.35 milliamps per square centimeter after 6 minutes of anodizing and with an intermediate value of 0.6 milliamps per square centimeter at a time of about 2.2 minutes.

Hard anodization is preferably controlled as to time duration in order that oxide of desirable electrical characteristics be obtained. This control, in practice, involves the avoidance of undesirable characteristics in the anodization process and may, for example, be accomplished by terminating the anodizing bias or forming voltage in response to a decrease in anodizing current. More precisely, this termination may be related to the attainment of a predetermined rate of current decrease in the anodizing current and may, in keeping with the current change rate of 0.025 milliamperes per minute indicated in the copending patent document, have a net change rate such as 0.4 milliamperes per minute.

The electrolyte for hard anodization may consist of a boric acid solution having 3% by weight of powdered $H_3BO_3$ received in de-ionized water. The hard anodize electrolyte is preferably of limited free water availability, as is attained by a 1 to 20 dilution of the electrolyte with ethylene glycol. The pH of the hard anodize electrolyte is preferably adjusted to 5.0 by titration with ammonium hydroxide ($NH_4OH$). An anodizing current having a time domain waveform which includes a region of smoothly decreasing current amplitude is desired.

The hard anodizing can be expected to convert some of the soft oxide to hard as well as to increase the thickness of the initial hard oxide layer.

Values of pH in the range of 5.0 to 5.4 have been found to be desirable.

A 20 minute bake at 130° C. between the soft and hard anodizations is found to be effective in eliminating most of the trapped water in the soft anodize oxide film. The anodization of FIGS. 2A and 2B is intentionally stopped short of consuming all of the available metallic aluminum in order that a capacitor electrode, that is a current carrying metallic aluminum path remain below the anodized material. This metallic conducting path is indicated at 211 in FIG. 2B.

A second layer of aluminum for the structure of FIG. 2 is indicated at 220 in FIGS. 2C and 2D. The deposition of this second layer of aluminum comprises the second step of the FIG. 2 sequence and involves the use of a shadow mask as indicated at 222. By way of the shadow mask, the deposited aluminum can be excluded from the anodize free portion 202 in FIGS. 2A and 2B plus an additional region of oxide indicated at 225 in FIG. 2D. These exclusions allow the second layer of aluminum 220 to be electrically isolated from the metal of the conducting path 211. The exposed surface of the oxide 208 which is provided by the shadow mask controlled deposition of aluminum in FIGS. 2C and 2D is also indicated by the receiver 208 in FIG. 2C. The second layer status of the aluminum layer 220 is indicated by the superscript 2 in the chemical symbols for the aluminum metal shown at 226 in FIGS. 2C and 2D. Element identification numbers from FIGS. 2A and 2B are repeated in FIGS. 2C and 2D and in the later portions of FIG. 2 as needed in order to identify previously described parts of the structure.

Following a moisture removing bake, capacitances between the second layer 220 and the metallic aluminum conducting path 211 in FIGS. 2A and 2B, can be expected to be in the range of 16.76 nanofarads per square centimeter or about 477 nanofarads for the entire wafer, assuming a three inch wafer is used.

Step three in the FIG. 2 sequence, achieves anodization of a portion of the second aluminum layer. A region of non-anodization in the nature of the anodize excluded portion 202 in FIGS. 2A and 2B is also provided in the anodization of FIG. 2E and 2F in order to provide space for a diametrically opposite attaching of the lead and clip 206 and 204 and for subsequent use in providing current flow into the conducting path 235- which is in the nature of the conducting path 211 in FIG. 2B. The second layer anodization, its chemical composition symbol and superscript identification as a second layer are indicated at 232 in FIGS. 2E and 2F.

A constant current anodizing sequence is also preferred for the soft anodizing portion of the FIGS. 2E and 2F step. During this soft anodizing, a current density of 1.5 milliamps per centimeter squared is, again, preferred and this current density results in an anodizing voltage in the range of seven to eight volts. Anodization may be maintained for a period near nine minutes; voltage rise occurs over the first two minutes of the anodization time.

During the hard anodizing step, a constant voltage anodizing at the largest possible voltage is preferred. A voltage level of 120 volts provides a peak current density of approximately 0.86 milliamps per square centimeter which falls off exponentially. Anodizing voltage at this level may, however, introduce arcing on the surface regions of the workpiece so that a voltage level near 50 volts appears preferable for the anodizing. With the 50 volt potential applied, the hard anodizing current falls to a level near 0.06 milliamps per centimeter squared of area after some 3.5 minutes of anodizing. The stepped anodizing voltage described in the above referred to co-pending patent document is especially applicable to the higher-level soft to hard anodization of the present capacitor. Arrangements wherein the hard anodizing voltage is stepped in 100 volt increments at periodic time intervals of between six and eight minutes each is found to be desirable. Hard anodize termination in response to attaining a predetermined rate of change of anodizing current may be employed in this instance.

Anodizations accomplished at the step three, second capacitor level in FIGS. 2E and 2F may also affect the characteristics of the capacitance formed between the second layer aluminum 220 and the conducting path 211. After second level soft anodization, for example, the first level capacitance density may fall from the above quoted 16.76 nanofarads per centimeter squared to a value in the range of 11.8 nanofarads per centimeter squared with a subsequent fall to a value near 11.6 nanofarads per centimeter squared after hard anodization at the second level. This change of capacitance density is believed to be associated with secondary anodization or swelling of the sublevel elements occurring principally during subsequent level soft anodizations. Capacitance density of the first level capacitors is found to change little during subsequent aluminum deposits, however.

Figure 3:
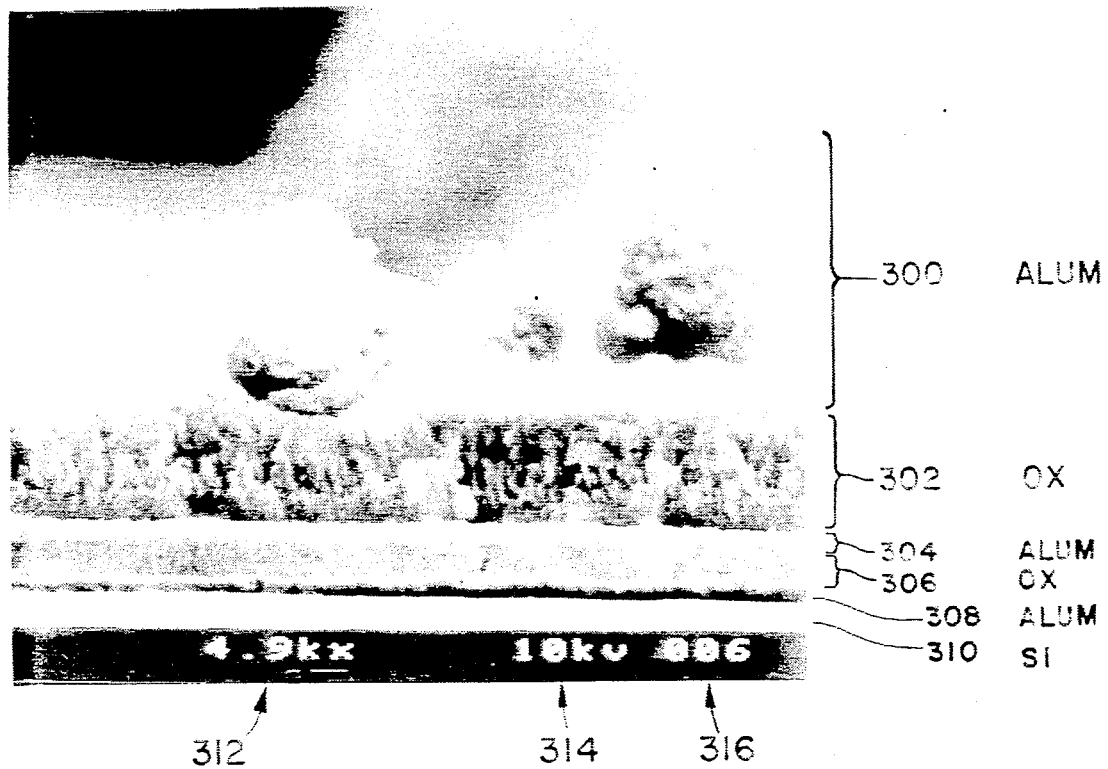
FIG. 3 shows a cleaved cross-section scanning electron microscope image of a three level capacitor made according to the invention.

By way of rotating the wafer 200 during the anodization of step three in FIG. 2, the anodize excluded portion 234 in the second layer is excluded from the anodize operation and a line of demarcation 233 between this anodize excluded region 234 and the anodized region 230 is formed. Anodization is precluded on the non-anodized first layer surface 224 in the step three operation by way of the metallic aluminum conducting path 211 being allowed to remain in an electrically isolated state during the step three anodization—that is, the clip 204 in FIG. 3 provides anodization forming current only to the second layer aluminum 220 during the step three anodization.

Shadow masking, as in step two of the FIG. 2 sequence, is again, employed in the step four sequence in order that the anodize excluded portion 234 remain free of the aluminum metal 236 which is deposited in the step four operation. The aluminum metal 236 is placed into electrical connection with the metallic aluminum of the path 211 at the non-anodized first layer surface 224 which is shown in dotted form in FIG. 2H of the step four drawings. The aluminum metal 236 is indicated as being third level in the FIG. 2 capacitor by the symbol shown at 238 in FIG. 2H.

During third level soft anodization, the preferred current density of 1.5 milliamps per centimeter squared results in an anodizing voltage in the range of two volts which tapers off after two minutes of anodization to about 1.65 volts. The waveforms of FIG. 4 in the above identified co-pending patent document describe a stepped anodizing voltage waveform and stepped anodizing current levels which are relevant for the level three anodization of FIGS. 2G and 2H.

The hard anodization forming voltage shown in the FIG. 4 drawing of the related co-pending patent document involves a voltage waveform that is stepped periodically with each step increase being a voltage change that is just short of the arcing voltage for conditions existing on the workpiece at that time instant. Further anodization of the lower level films also occurs while the level three dielectric is being formed.

The second level anodization, that is, the anodized region 230 in FIG. 2, may typically have a dielectric film thickness in the range of 7500 Å, and achieve a relative permativity of 70 and a third layer capacitance density in the range of 30 nanofarads per centimeter squared. The second to third level capacitance density can be expected to be in the range of 91 nanofarads per centimeter squared. The total capacitance density for the three layer structure of FIG. 2H can be expected to be in the range of 102 nanofarads per centimeter squared.

FIG. 3 in the drawings shows a Scanning Electron Microscope (SEM) cross-sectional view of a cleaved cross-section of a three-layer capacitor such as the capacitor of FIG. 2H in FIG. 2. In the FIG. 3 cross-sectional view, the aluminum metal 236 of FIG. 2H is shown at 300 and the oxide of the anodized region 230 in FIG. 2H appears at 302. Similarly, the metallic conducting path 235 in FIG. 2, appears at 304 in FIG. 3, the oxide material 208 appears at 306 in FIG. 3 and the metallic aluminum conducting path 211 appears at 308 in FIG. 3. The silicon substrate 212 in FIG. 2 appears at 310 in the FIG. 3 SEM cross-section. The granular appearance of the aluminum layers 300, 304, and 308 in FIG. 3 is partially the result of the sample shown in FIG. 3 having been submerged in the cold temperature of liquid nitrogen prior to the cleaving operation—in order to assure a satisfactory cleaving break for SEM examination.

Table I below shows the breakdown voltage performance achievable in a capacitor fabricated according to the FIG. 2 sequence.

TABLE I

| # | $L_N$ | $V_f$ | $V_b$ |
|---|---|---|---|
| 1 | 2 | * | 90-100** |
| 2 | 3 | 514 | 620 |
| 3 | 3 | 514 | 520 |
| 4 | 3 | 514 | 560 |
| 5 | 3 | 514 | 600 |
| 6 | 1 | 200 | *** | where # is the test sample number
where $L_N$ is the dielectric layer number
where $V_f$ is the maximum forming voltage
where $V_b$ is the breakdown voltage
dv/dt is 2 Volts/Sec for the test voltage
*The maximum forming voltage is probably closer to 50 V but is not easily defined for this anodization.
**Voltage readings erratic above 90 V
***$V_b$ not determinable.

The Table I forming voltage and breakdown voltage values relate to individual layers of the FIG. 2 and FIG. 3 capacitor structure.

At the point of breakdown in the Table I samples, arcing is widely distributed. This phenomenon suggests the trapping of some substance in the porous structure of the upper part of the film and vaporization of this substance. The trapping of a dielectric by-product of the anodizing bath could explain the relatively high permativity, in the range of 70, prevailing for the FIGS. 2 and 3 structure. The 4900 times magnification of the FIG. 3 cross-sectional view is indicated at 312 in FIG. 3 while the 10 Kv accelerating potential and the sample identity are indicated at 314 and 316 in FIG. 3.

Variations of the FIG. 1 and FIG. 2 process may be employed for achieving selected results, one such variation involves rotation of the wafer by 90 degrees rather than by the 180 degrees rotation of the processing of step three in FIG. 2. By way of such 90 degrees rotation, individual layer access to the aluminum metal 236 and the aluminum conducting path 211 may be arranged where individual testing of these layers is desirable. The illustrated 180 degrees rotation is, of course, more convenient for achieving a realistic capacitor having fabrication accomplished layer inter/connections. Another desirable variation from the above described fabrication sequence, which would be especially desirable in a manufacturing sequence, involves the selection of uniform anodization and other parameters in the fabrication of each layer in a multilayered capacitor. The variations in processing disclosed herein are illustrative in the range of parameter selection possible in such capacitor fabrication but are not intended to be optimum for attaining desirable electrical characteristics or convenient manufacturing.

ELECTRICAL CHARACTERISTICS

The energy storage density in a multi-layered anodic film capacitor according to the above fabrication arrangement is predicted by the equation:

$$E_d = E/\text{Vol} \quad (1)$$
$$= (C \times V^2)/(2 \times \text{Vol}) \quad (2)$$
$$= (\epsilon_r \times \epsilon_o \times A \times V^2)/(2 \times t_i \times (A \times t)) \quad (3)$$
$$= (\epsilon_r \times \epsilon_o \times V^2)/(2 \times t_i \times t) \quad (4)$$

Where
$t = t_i + t_m$
$t_i$ = thickness of the dielectric
$tm$ = thickness of the metal
$\epsilon_r$ = relative permittivity of the dielectric
$\epsilon_o$ = permittivity of free space (i.e. $8.854 \times 10^{-12}$ F/M)
V = voltage across the capacitor plates
Vol = volume of the capacitor cell
$E_d$ = energy density (e.g. in joules/cm$^3$)

From the above equation (4), it is clear that large values for $\epsilon_r$ and V and minimum values for t are desirable in order to achieve maximum energy storage density.

For the capacitor fabricated according to the preceding method, the terms in the equation (4) may have values according to the following table:

TABLE II

| | |
|---|---|
| t = | 1 um (per layer) |
| $t_m$ = | 7000 Å |
| $\epsilon_r$ = | 19-70 (effective) |
| $\epsilon_o$ = | $8.854 \times 10^{-12}$ F/M |
| V = | 620 |

The $\epsilon_r$ value range recited here is in comparison with the historic range of 8 to 12 for this characteristic in prior capacitors.

Effective dielectric constants of up to approximately 70, volume resistivities of up to $1.2 \times 10^{18}$ ohm-cm and breakdown voltages up to 2.38 times that of the hard anodization forming voltage are attainable with the present dielectric and capacitor arrangement.

With energy density values in this range and with capacitor average mass density of 3.3 grams per cubic centimeter for the capacitor system, the storage of one magajoule of energy can be accomplished in a volume of about 1.07 cubic feet and at a weight of about 100 kilograms or 220 pounds. This energy storage capability is approximately a 200 fold increase over the 40 joules per kilogram capability of currently available capacitors. The $\epsilon_r$ values recited in Table II correspond to energy density values in the range of 46 magajoules per cubic meter to 170 megajoules per cubic meter.

Capacitors fabricated according to the herein described method are found to be amenable to a short-circuit clearing or healing process wherein a very gradually increasing DC voltage is applied to the capacitor electrodes until the flowing current is observed to jump momentarily and then drop to a very low level—a level in the nanoampere range. This clearing ability can be useful in a manufacturing environment.

The above method of fabricating a thin film energy storage capacitor may be used for achieving capacitors having many layers so long as appropriate electrical interconnection arrangements are provided and so long as the oxide etching or other surface smoothness providing steps are incorporated into the fabrication sequence. The exclusion of electrical stress concentrating and progressing surface roughness in the successive layers of a capacitor is especially desirable in multiple layer capacitor arrangements.

In either the environment where capacitor voltages that are beyond the capability of single anodize film layer is desired or where the consequences of electrical failure in an individual anodize layer are to be avoided, the serial and parallel connection of multiple capacitor elements can be a useful addition to the herein described capacitor. Structures in which several stacked individual capacitor layers are electrically connected in series and with a plurality of the series connected stacks being connected in electrical parallel can be responsive to needs which are beyond the capability of a single film layer capacitor. Capacitor banks of this nature might be used, for example, in space weapon applications where equipment accessibility for capacitor replacement or repair is severely limited.

Although the capacitor invention herein has been disclosed in terms of thin film elements that are resident on a rigid substrate such as a silicon wafer, it will be understood by persons skilled in the art that the underlying concepts of the capacitor may be employed in rolled foil capacitors, electrolytic capacitors and other types of capacitors which find application in the electrical art.

The capacitor arrangement described herein is, therefore, capable of providing significantly improved energy storage density. The use of improved dielectric materials involving metallic oxides which have been transformed from the soft to the hard state is especially contributing to these capacitor improvements. Although the invention has been disclosed in connection with aluminum oxide dielectric materials, persons skilled in the art will also recognize the applicability of the capacitor concepts to tantalum and other materials.

While the apparatus and method herein described constitute a preferred embodiment of the invention, it is to be understood that the invention is not limited to this precise form of apparatus or method and that changes may be made therein without departing from the scope of the invention which is defined in the appended claims.

We claim:
1. A method for fabricating a capacitor having an aluminum oxide electrical insulation layer of dielectric breakdown capability exceeding the oxide formation voltage, on a silicon substrate supported sputtered metallic aluminum film comprising the steps of:

forming on said silicon substrate supported sputtered metallic aluminum film a first electrolyte anodization layer of porous soft aluminum oxide, said forming step including soft anodizing in a sulfuric acid electrolyte maintained at a temperature of six degrees Celsius and also a constant anodizing current density per square centimeter of aluminum film surface;

hard anodize transforming at least a portion of said porous soft aluminum oxide to a harder layer by anodizing in an ethylene glycol diluted aqueous boric acid electrolyte solution which has been adjusted to a pH of five to five and four tenths by the addition of ammonium hydroxide using a constant anodizing voltage or stepwise incremented successively larger magnitudes of constant anodizing voltage and terminating the hard anodizing when the anodizing current rate of change attains a non-zero value of 0.025 milliamperes per square centimeter per minute or less; and forming over said layers of aluminum oxide a second layer of aluminum which is electrically insulated from said sputtered metallic aluminum film by said oxide layers.

2. The method of claim 1 wherein said hard anodizing transforming step is performed using a constant anodizing voltage of three hundred volts.

3. The method of claim 2 wherein said hard anodize transforming step is terminated when the anodizing current rate of change falls below 0.4 milliamperes per minute.

4. The electrical capacitor formed by the process of claim 1.

* * * * *